(12) United States Patent
Hsu et al.

(10) Patent No.: US 6,916,736 B2
(45) Date of Patent: Jul. 12, 2005

(54) METHOD OF FORMING AN INTERMETAL DIELECTRIC LAYER

(75) Inventors: Fu-Hsiang Hsu, Keelung (TW);
U-Way Tseng, Taichung (TW);
Hung-Yu Chiu, Kaohsiung (TW);
Shih-Liang Chou, Pingtung (TW);
Shin-Yi Chou, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 152 days.

(21) Appl. No.: 10/390,691

(22) Filed: Mar. 19, 2003

(65) Prior Publication Data

US 2003/0181030 A1 Sep. 25, 2003

(51) Int. Cl.$^7$ .................... H01L 21/4763; H01L 21/302
(52) U.S. Cl. .................. 438/624; 438/637; 438/639; 438/692
(58) Field of Search .................... 438/624, 627, 438/632, 692, 637–640

(56) References Cited

U.S. PATENT DOCUMENTS

| | | | | |
|---|---|---|---|---|
| 5,252,515 A | * | 10/1993 | Tsai et al. .................. | 438/624 |
| 5,403,780 A | * | 4/1995 | Jain et al. .................. | 438/624 |
| 6,077,784 A | * | 6/2000 | Wu et al. .................. | 438/691 |
| 6,281,116 B1 | * | 8/2001 | Yanagida .................. | 438/637 |

FOREIGN PATENT DOCUMENTS

TW             87111392         12/1999

* cited by examiner

Primary Examiner—Ha Tran Nguyen
(74) Attorney, Agent, or Firm—Birch, Stewart, Kolasch & Birch, LLP

(57) ABSTRACT

A method of forming an intermetal dielectric (IMD) layer. At least one metal wire is formed on a substrate. A filling oxide layer is formed on the substrate and the metal wire. The surface of the filling oxide layer is smoothed. A first silicon-rich oxide layer is formed on the filling oxide layer, where the refractive index (RI) of the first silicon-rich oxide layer is 1.6~1.64. A second silicon-rich oxide layer is formed on the first silicon-rich oxide layer, where the refractive index of the second silicon-rich oxide layer is 1.49~1.55. According to the present method, the diffusion of mobile hydrogen ions is blocked by manufacture with dual silicon-rich oxide layers.

12 Claims, 8 Drawing Sheets

METHOD OF FORMING AN INTERMETAL DIELECTRIC LAYER

BACKGROUND OF THE INVENTION

1. Field of the Invention

The present invention relates to the semiconductor manufacturing process, and more particularly, to a method of forming an intermetal dielectric (IMD) layer which can block the diffusion of mobile hydrogen ions.

2. Description of the Related Art

Nonvolatile memory cell arrays such as EPROMs, FLASH EPROMs and EEPROMs have gained widespread acceptance in the industry. It has been observed that there are data retention problems in nonvolatile memory cell arrays. It has been postulated that the poor data retention is due to mobile hydrogen ions that diffuse to the floating gate in the nonvolatile memory cell and cause the charge on the floating gate to be lost. For example, a passivation layer (of a high dielectric reflowable material such as phosphosilicate glass or borophosphosilicate glass) is formed on the wafer. The manufacturing process for forming the passivation layer causes the mobile hydrogen ions to be introduced. The mobile hydrogen ions can penetrate intermetal dielectric (IMD) layers to approach the floating gate in the nonvolatile memory cell, seriously affecting device reliability. Thus, providing an intermetal dielectric (IMD) layer that can block the diffusion of the mobile hydrogen ions is called for.

FIGS. 1A~1B illustrate the formation of an intermetal dielectric (IMD) layer of the prior art. In FIG. 1A, a substrate 10 including a memory cell such as a FLASH cell is provided. In order to simplify the illustration, the conventional memory cell is not shown. A plurality of metal wires 12 are formed on the substrate 10. Then, using high-density plasma chemical vapor deposition (HDPCVD), a first $SiO_2$ layer 16 is formed on the metal wires 12 and the substrate 10.

In FIG. 1B, using plasma enhanced chemical vapor deposition (PECVD), a second $SiO_2$ layer 18 is formed on the first $SiO_2$ layer 16. Then, a planarization is performed to smooth the surface of the second $SiO_2$ layer 18. Thus, a conventional intermetal dielectric (IMD) layer 20 including the first $SiO_2$ layer 16 and the second $SiO_2$ layer 18 is formed on the metal wires 12 and the substrate 10.

Since silicon oxide layers cannot effectively block the mobile hydrogen ions that diffuse to the substrate 10, the traditional intermetal dielectric (IMD) layer 20 cannot solve the problem mentioned previously.

SUMMARY OF THE INVENTION

It is therefore an object of the present invention to provide a method of forming an intermetal dielectric (IMD) layer.

It is another object of the present invention to provide a method for blocking the diffusion of mobile hydrogen ions by manufacture with dual silicon-rich oxide layers.

To accomplish the above objects, the present invention provides a method of forming an intermetal dielectric (IMD) layer. At least one metal wire is formed on a substrate. A filling oxide layer is formed on the substrate and the metal wire. The surface of the filling oxide layer is smoothed. A first silicon-rich oxide layer is formed on the filling oxide layer, where the refractive index (RI) of the first silicon-rich oxide layer is 1.6~1.64. A second silicon-rich oxide layer is formed on the first silicon-rich oxide layer, where the refractive index (RI) of the second silicon-rich oxide layer is 1.49~1.55.

The present invention improves on the prior art in that the intermetal dielectric (IMD) layer has dual silicon-rich oxide layers. The second silicon-rich oxide layer whose refractive index (RI) is 1.49~1.55 is formed on the first silicon-rich oxide layer whose refractive index (RI) is 1.6~1.64. The intermetal dielectric (IMD) layer effectively blocks the diffusion of the mobile hydrogen ions and prevents the particle from occurring when performing plasma cleaning after the subsequent via hole etching. Thus, the invention can block the mobile hydrogen ions from diffusing into the substrate, thereby improving reliability and ameliorating the disadvantages of the prior art.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood from the detailed description given hereinbelow and the accompanying drawings, which are given by way of illustration only, and thus are not limitative of the present invention and wherein.

DETAILED DESCRIPTION OF THE INVENTION

The First Embodiment

Figure 1A:
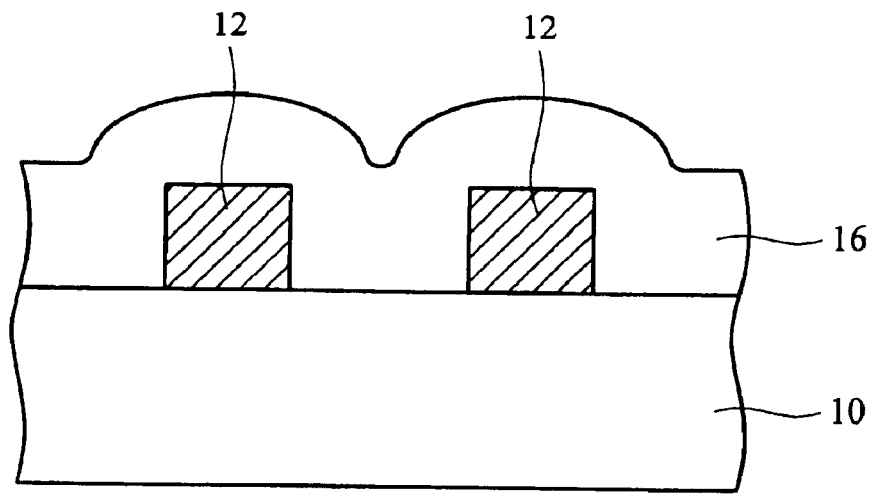
FIGS. 1A~1B are sectional views of the method of forming a traditional intermetal dielectric (IMD) layer.
Figure 1B:
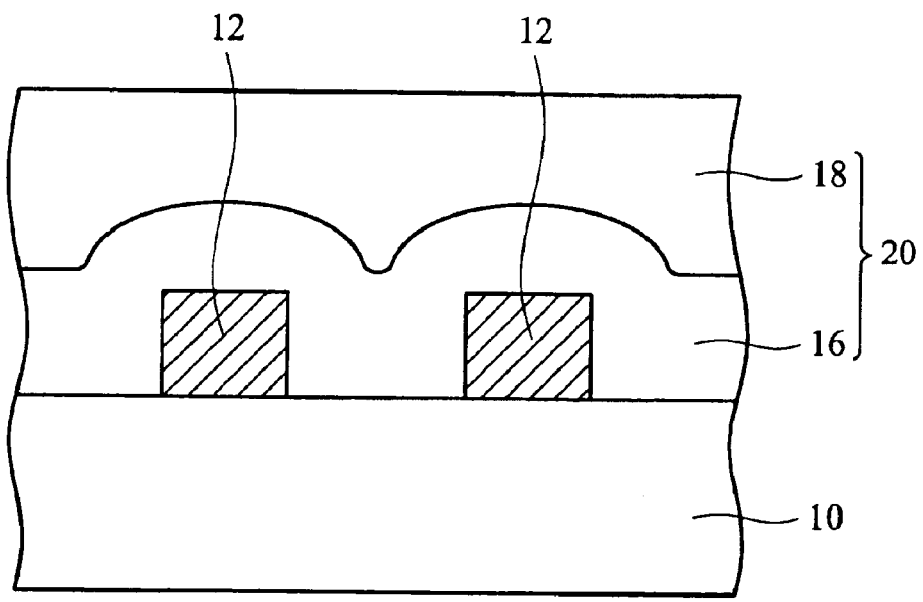
Figure 2A:
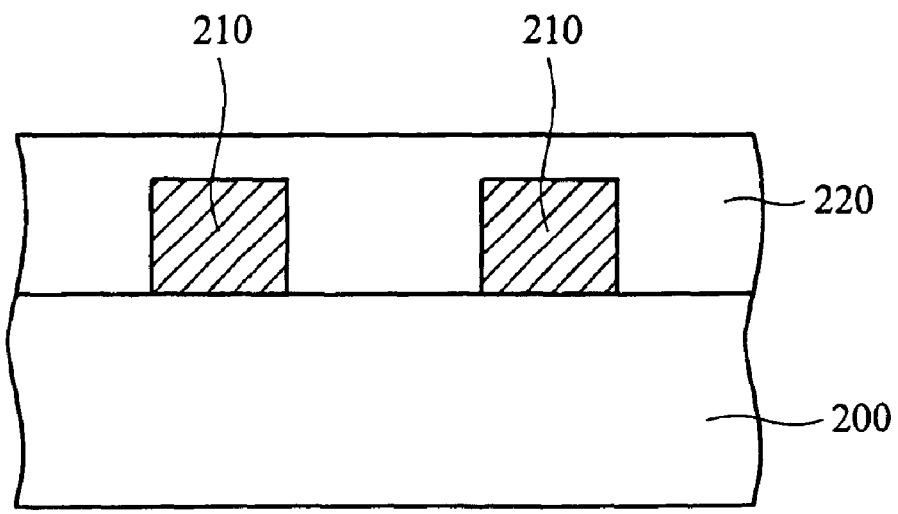
FIGS. 2A~2B are sectional views of the method of forming an intermetal dielectric (IMD) layer according to the first embodiment of the present invention.
Figure 2B:
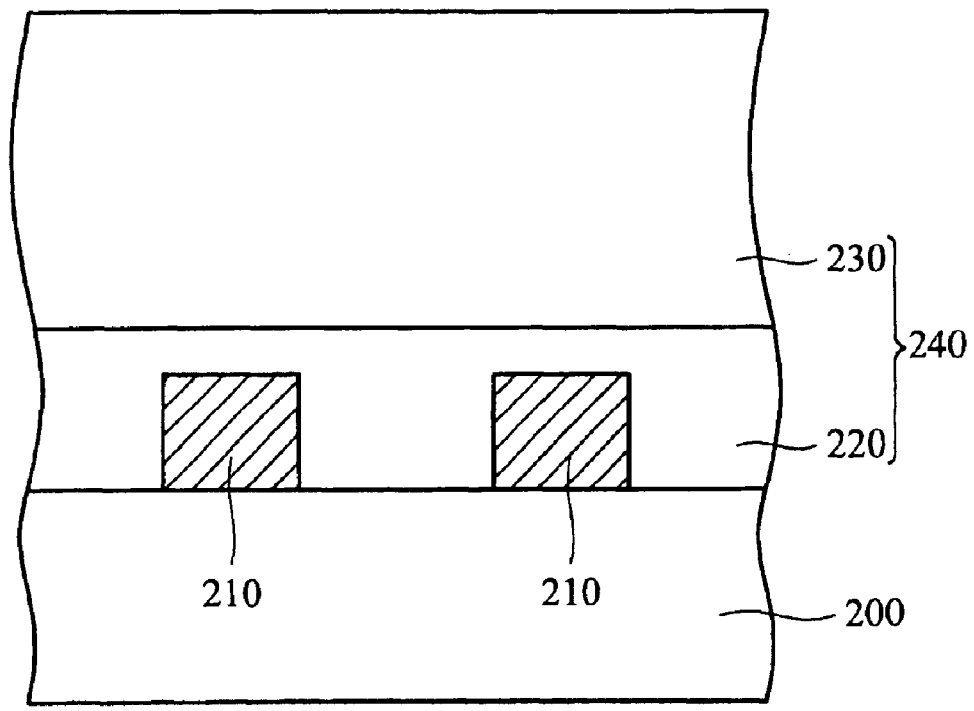

FIGS. 2A~2B are sectional diagrams of the first embodiment of the present invention.

In FIG. 2A, a substrate 200 including a memory cell such as a FLASH cell is provided. In order to simplify the illustration, the conventional memory cell is not shown. At least one metal wire 210 is formed on the substrate 200. Then, using high-density plasma chemical vapor deposition (HDPCVD) and/or plasma enhanced chemical vapor deposition (PECVD), a filling oxide layer 220 is formed on the metal wire 210 and the substrate 200. The filling oxide layer 220 may be, for example, a TEOS-SiO$_2$ layer. Then, the surface of the filling oxide layer 220 is smoothed by CMP or etching.

In FIG. 2B, using deposition such as CVD, a silicon-rich oxide layer 230 with refractive index (RI) 1.49~1.55 is formed on the filling oxide layer 220. Thus, an intermetal dielectric (IMD) layer 240 including the filling oxide layer 220 and the silicon-rich oxide layer 230 is formed on the metal wire 210 and the substrate 200. The silicon atoms of the silicon-rich oxide layer 230 connect hydrogen atoms to form dangling bonds; thus mobile hydrogen ions are blocked from diffusing to the substrate 200. The CVD's operation for forming the silicon-rich oxide layer 230 can be under the conditions of 330 W for RF power, 400° C. for temperature, and introducing SiH$_4$ at a flow rate of 400~600 sccm, N$_2$O at a flow rate of 350~550 sccm and N$_2$ at a flow rate of 1550~2500 sccm.

Figure 2C:
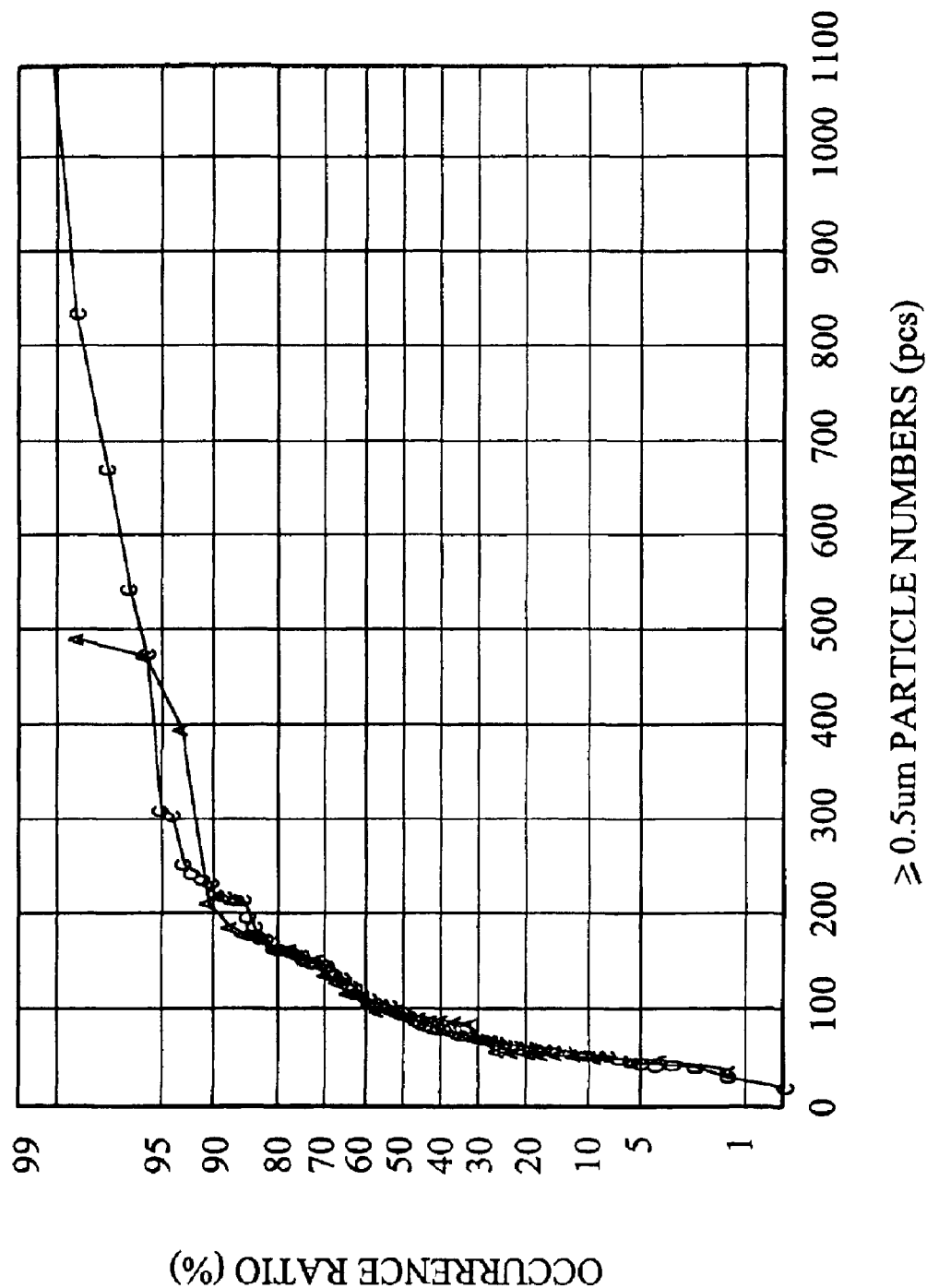
FIG. 2C is a graph showing the particle numbers versus occurrence ratio when the silicon-rich oxide layer whose refractive index (RI) is 1.49~1.55 is performed with argon plasma cleaning.

Moreover, after the subsequent via hole etching, an argon plasma cleaning procedure is often used. The inventors take wafers having the silicon-rich oxide layer 230 whose refractive index (RI) is 1.49~1.55 to be performed with argon plasma cleaning to check whether the silicon-rich oxide layer 230 has the particle problem. FIG. 2C is a graph illustrating that occurrence ratio of the particle ($\geq$0.5 μm) numbers on each wafer less than 200 pieces is about 90%. Additionally, in the actual manufacturing process, the particle numbers suddenly increase from the 3000$^{th}$ wafer having the silicon-rich oxide layer 230 during argon plasma cleaning. Thus, the silicon-rich oxide layer 230 whose refractive index (RI) is 1.49~1.55 has a minor particle problem during argon plasma cleaning.

The Second Embodiment

Figure 3A:
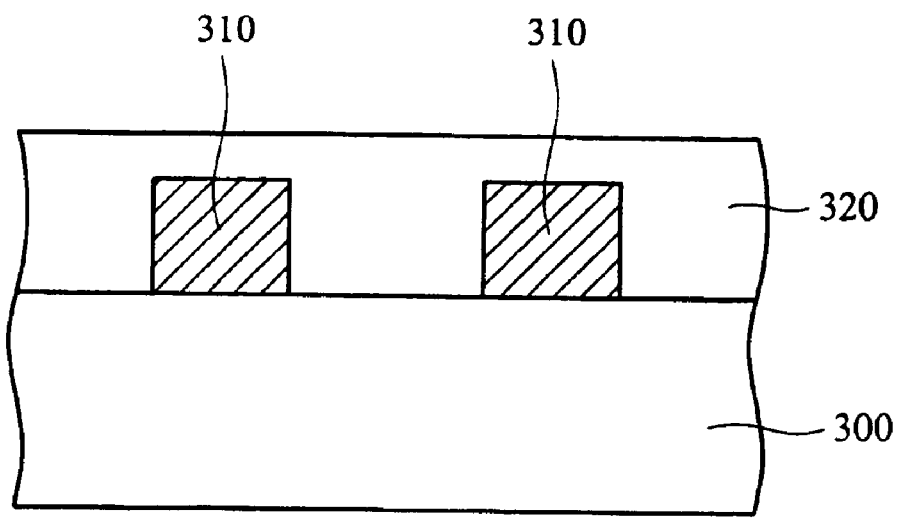
FIGS. 3A~3B are sectional views of the method of forming an intermetal dielectric (IMD) layer according to the second embodiment of the present invention.
Figure 3B:
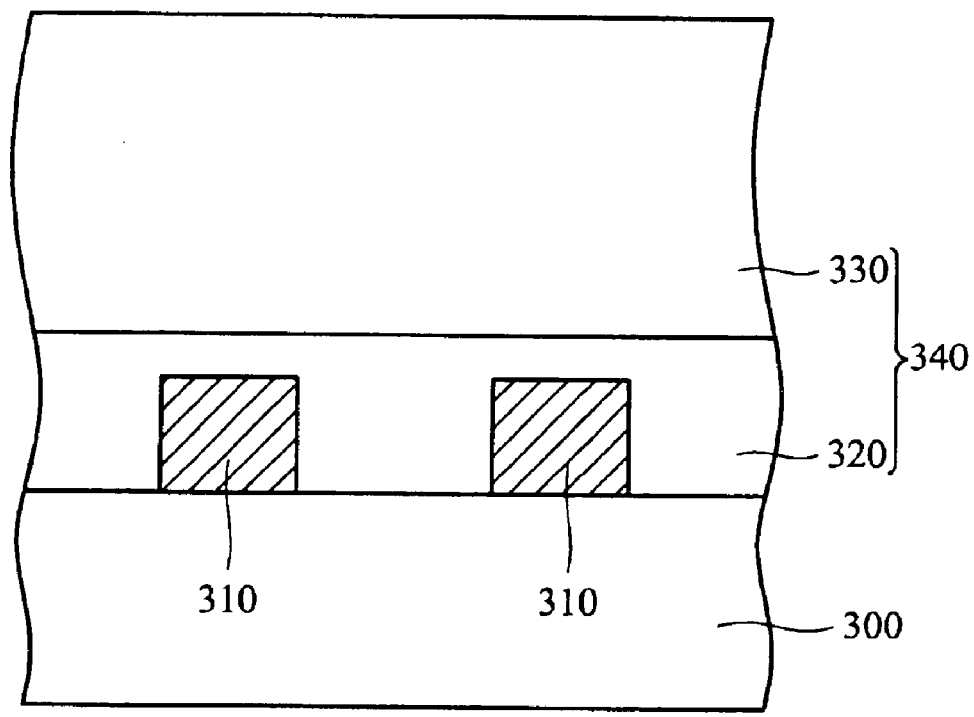

FIGS. 3A~3B are sectional diagrams of the second embodiment of the present invention.

In FIG. 3A, a substrate 300 including a memory cell such as a FLASH cell is provided. In order to simplify the illustration, the conventional memory cell is not shown. At least one metal wire 310 is formed on the substrate 300. Then, using HDPCVD and/or PECVD, a filling oxide layer 320 is formed on the metal wire 310 and the substrate 300. The filling oxide layer 320 may be, for example, a TEOS-SiO$_2$ layer. Then, the surface of the filling oxide layer 320 is smoothed by CMP or etching back.

In FIG. 3B, using deposition such as CVD, a silicon-rich oxide layer 330 whose refractive index (RI) is 1.6~1.64 is formed on the filling oxide layer 320. Thus, an intermetal dielectric (IMD) layer 340 including the filling oxide layer 320 and the silicon-rich oxide layer 330 is formed on the metal wire 310 and the substrate 300. The CVD's operation for forming the silicon-rich oxide layer 330 can be under the conditions of 600 W for RF power, 400° C. for temperature, and introducing SiH$_4$ at a flow rate of 400~600 sccm, N$_2$O at a flow rate of 350~550 sccm and N$_2$ at a flow rate of 1550~2500 sccm.

Specifically, compared with the silicon-rich oxide layer 230 whose refractive index (RI) is 1.49~1.55 of the first embodiment, the silicon-rich oxide layer 330 whose refractive index (RI) is 1.6~1.64 of the second embodiment has a better hydrogen blocking effect. The reason may be that the content of silicon in the silicon-rich oxide layer 330 is greater than the content of silicon in the silicon-rich oxide layer 230.

Figure 3C:
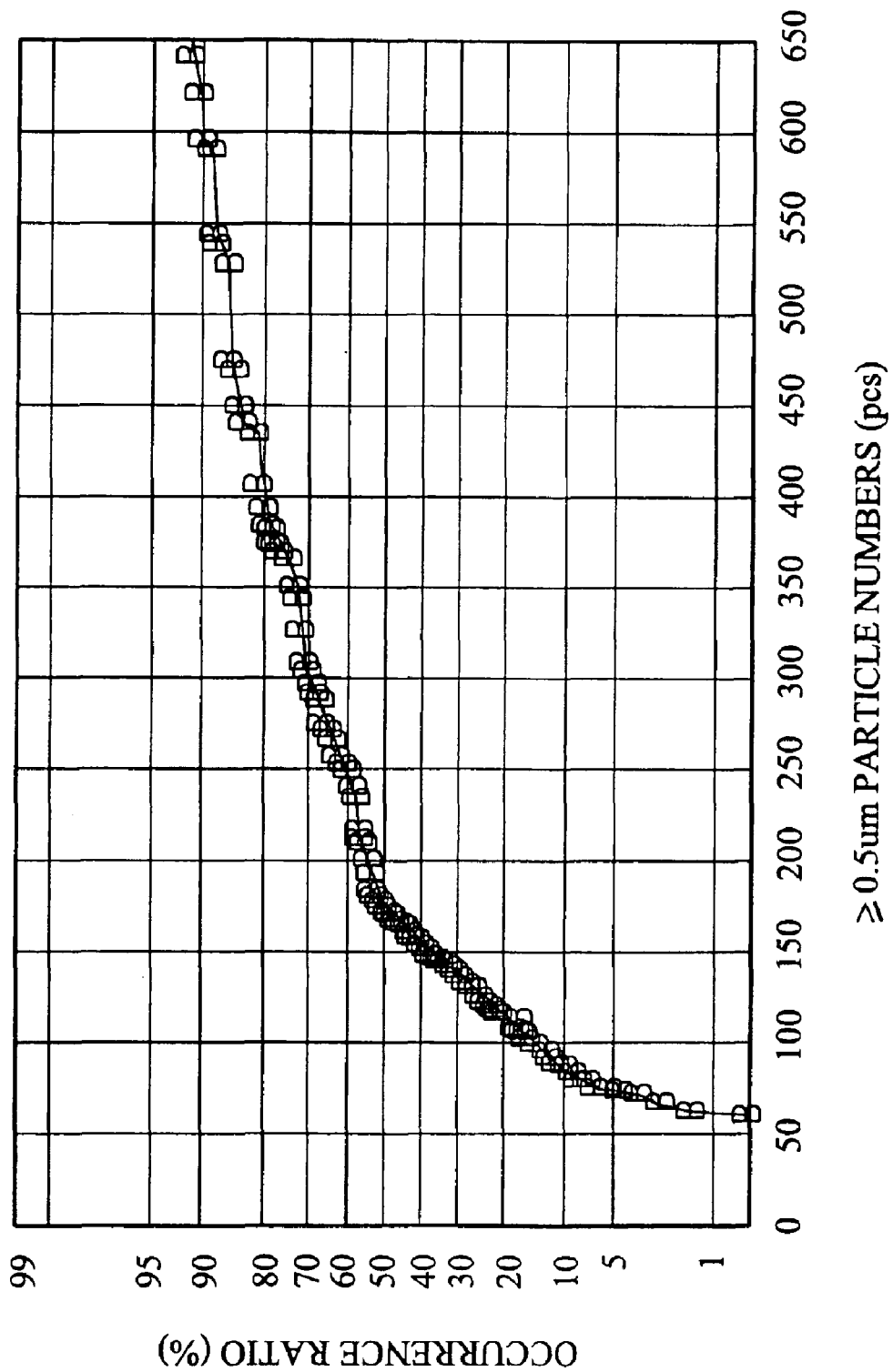
FIG. 3C is a graph showing the particle numbers versus occurrence ratio when the silicon-rich oxide layer whose refractive index (RI) is 1.6~1.64 is performed with argon plasma cleaning.
Figure 3D:
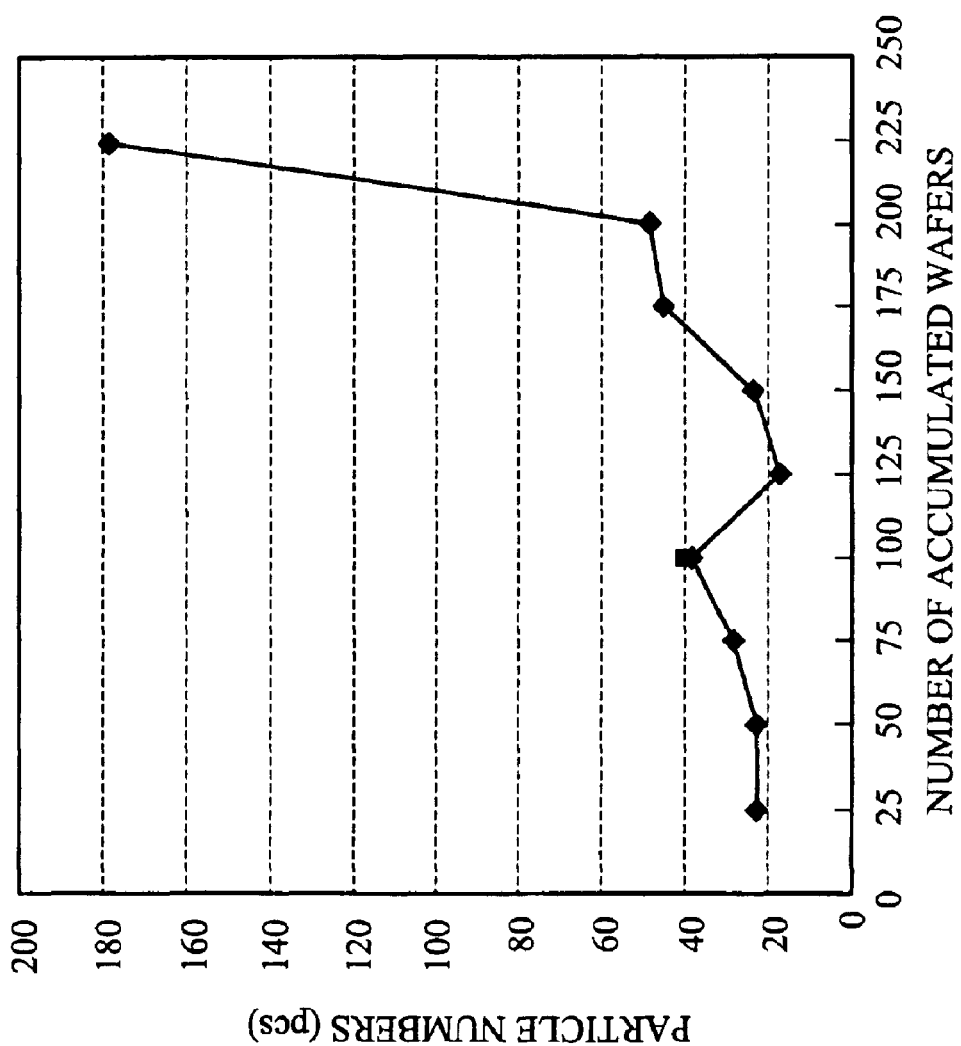
FIG. 3D illustrates the particle numbers suddenly increasing from the $200^{th}$ wafer having a silicon-rich oxide layer whose refractive index (RI) is 1.6~1.64 during argon plasma cleaning.

Moreover, after the subsequent via hole etching, an argon plasma cleaning procedure is often used. The inventors take wafers having the silicon-rich oxide layer 330 whose refractive index (RI) is 1.6~1.64 to be performed with argon plasma cleaning to check whether the silicon-rich oxide layer 330 has the particle problem. FIG. 3C is a graph illustrating that occurrence ratio of the particle ($\geq$0.5 μm) numbers on each wafer less than 200 pieces is only about 50%. Additionally, in the actual manufacturing process, the particle numbers suddenly increase from the 200$^{th}$ wafer having the silicon-rich oxide layer 330 during argon plasma cleaning, as shown as FIG. 3D. Thus, the silicon-rich oxide layer 330 whose refractive index (RI) is 1.6~1.64 has a worse particle problem during argon plasma cleaning.

According to the above embodiments, conclusions are as follows:

(1) With respect to the hydrogen blocking effect, the silicon-rich oxide layer whose refractive index (RI) is 1.6~1.64 is better than the silicon-rich oxide layer whose refractive index (RI) is 1.49~1.55.

(2) With respect to the particle problem, the silicon-rich oxide layer whose refractive index (RI) is 1.49~1.55 has less problem than the silicon-rich oxide layer whose refractive index (RI) is 1.6~1.64 during argon plasma cleaning.

The Third Embodiment

FIGS. 4A~4D are sectional diagrams of the third embodiment of the present invention.

Figure 4A:
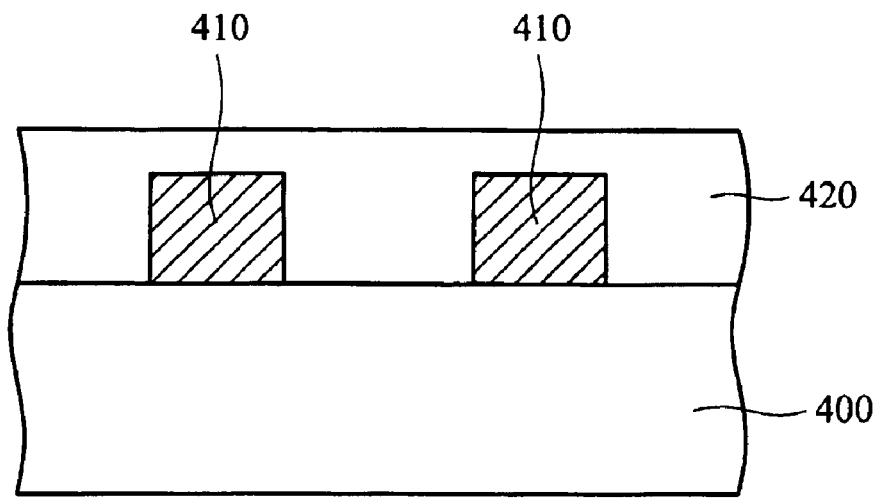
FIGS. 4A~4D are sectional views of the method of forming an intermetal dielectric (IMD) layer according to the third embodiment of the present invention.

In FIG. 4A, a substrate 400 including a memory cell such as a FLASH cell is provided. In order to simplify the illustration, the conventional memory cell is not shown. At least one metal wire 410 is formed on the substrate 400. Then, using HDPCVD and/or PECVD, a filling oxide layer 420 is formed on the metal wire 410 and the substrate 400. The filling oxide layer 420 may be, for example, a TEOS-SiO$_2$ layer. Then, the surface of the filling oxide layer 420 is smoothed by CMP or etching.

Figure 4B:
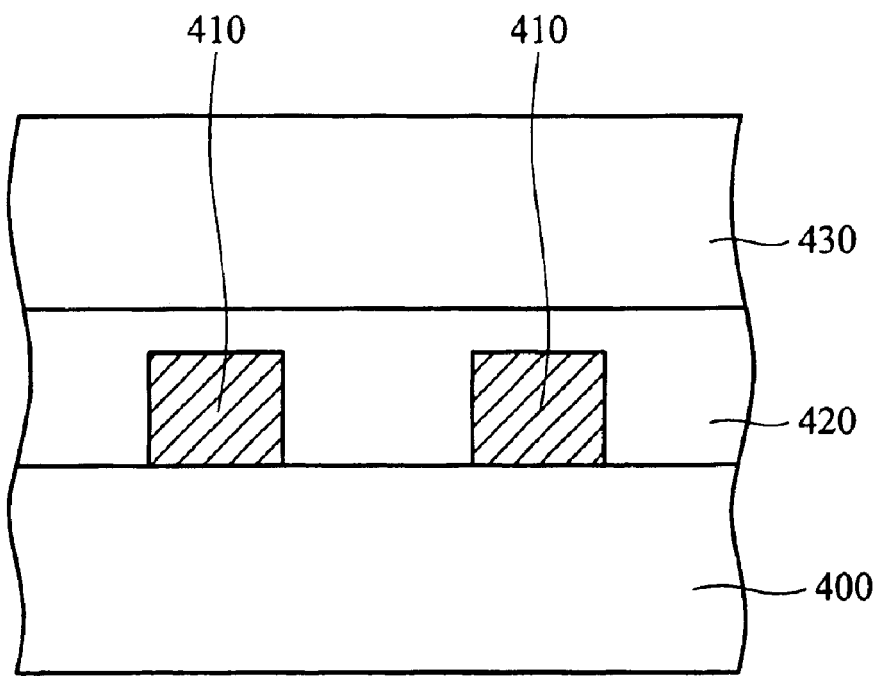

In FIG. 4B, using deposition such as CVD, a first silicon-rich oxide layer 430 whose refractive index (RI) is 1.6~1.64 is formed on the filling oxide layer 420. The thickness of the first silicon-rich oxide layer 430 is about 1800~2200 angstroms. The CVD's operation for forming the first silicon-rich oxide layer 430 can be under the conditions of 600 W for RF power, 400° C. for temperature, and introducing SiH$_4$ at a flow rate of 400~600 sccm, N$_2$O at a flow rate of 350~550 sccm and N$_2$ at a flow rate of 1550~2500 sccm.

Figure 4C:
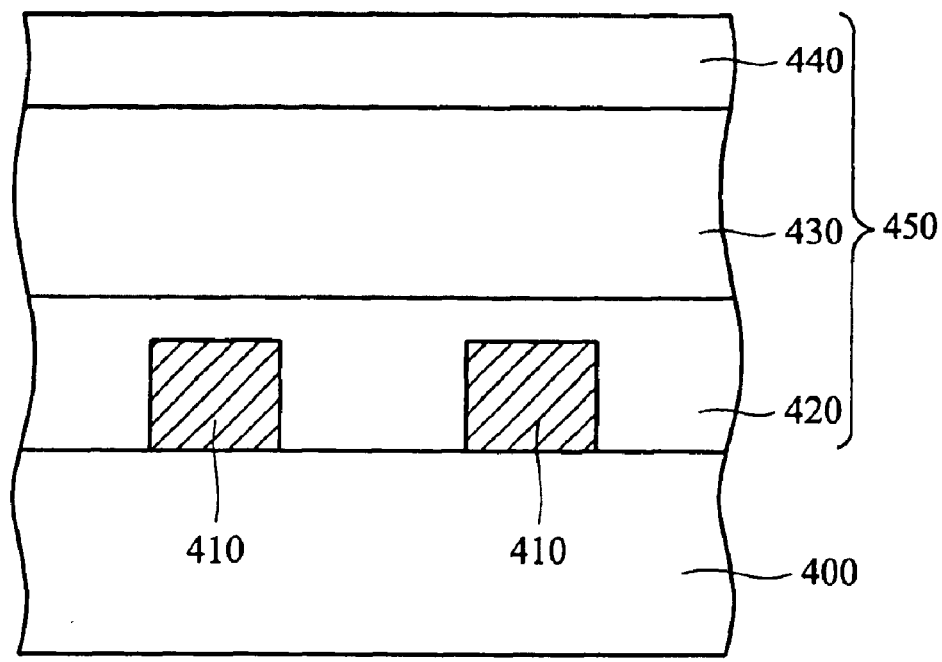

In FIG. 4C, using deposition such as CVD, a second silicon-rich oxide layer 440 whose refractive index (RI) is 1.49~1.55 is formed on the first silicon-rich oxide layer 430. The thickness of the second silicon-rich oxide layer 440 is about 800~1200 angstroms. The CVD's operation for forming the second silicon-rich oxide layer 440 can be under the conditions of 330 W for RF power, 400° C. for temperature, and introducing SiH$_4$ at a flow rate of 400~600 sccm, N$_2$O at a flow rate of 350~550 sccm and N$_2$ at a flow rate of 1550~2500 sccm.

Thus, an intermetal dielectric (IMD) layer 440 including the filling oxide layer 420, the first silicon-rich oxide layer 430 and the second silicon-rich oxide layer 440 is formed on the metal wire 410 and the substrate 400.

Figure 4D:
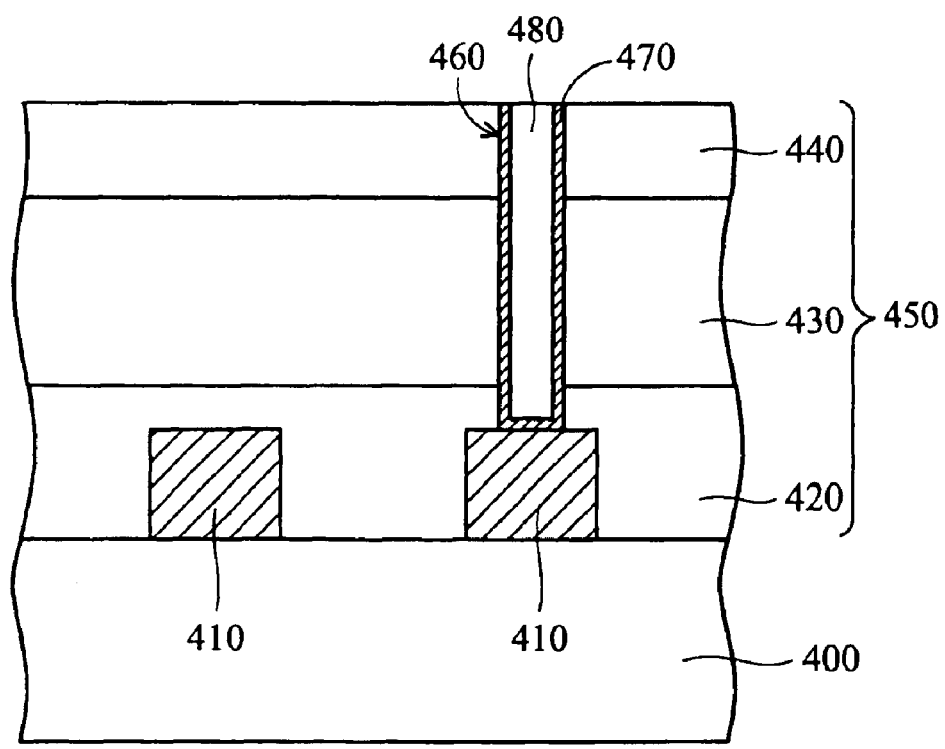

In FIG. 4D, a via hole 460 penetrating the second silicon-rich oxide layer 440, the first silicon-rich oxide layer 430 and the filling oxide layer 420 is formed by photolithography to expose the surface of the metal wire 410. Then, a cleaning procedure such as argon plasma cleaning is performed. A barrier layer 470 such as Ti/TiN layer is formed on the sidewall and the bottom of the via hole 460. Then, conductive material such as tungsten (W) is filled in the via hole 460 to form a conductive plug 480.

It should be noted that the intermetal dielectric (IMD) layer 450 has dual silicon-rich oxide layers 430, 440. The first silicon-rich oxide layer 430 whose refractive index (RI)

is 1.6~1.64 can effectively block the mobile hydrogen ions to diffuse to the substrate 400. The second silicon-rich oxide layer 440 whose refractive index (RI) is 1.49~1.55 can effectively prevent the intermetal dielectric (IMD) layer 450 from causing particles during plasma cleaning.

Therefore, the present invention provides a method of forming an intermetal dielectric (IMD) layer with dual silicon-rich oxide layers including a silicon-rich oxide lower layer whose refractive index (RI) is 1.6~1.64 and a silicon-rich oxide upper layer whose refractive index (RI) is 1.49~1.55. The silicon-rich oxide lower layer effectively blocks the mobile hydrogen ions for diffusion, and the silicon-rich oxide upper layer effectively prevents the intermetal dielectric (IMD) layer from causing particles during plasma cleaning. Thus, the invention can block the mobile hydrogen ions to diffuse to the substrate, thereby improving device reliability and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming an intermetal dielectric (IMD) layer, comprising the steps of:

providing a substrate;

forming at least one metal wire on the substrate;

forming a filling oxide layer on the substrate and the metal wire;

smoothing the surface of the filling oxide layer;

forming a first silicon-rich oxide layer on the filling oxide layer, wherein a refractive index (RI) of the first silicon-rich oxide layer is 1.6~1.64; and forming a second silicon-rich oxide layer on the first silicon-rich oxide layer, wherein a refractive index (RI) of the second silicon-rich oxide layer is 1.49~1.55.

2. The method according to claim 1, further comprising the steps of:

forming a via hole through the second silicon-rich oxide layer, the first silicon-rich oxide layer and the filling oxide layer to expose the surface of the metal wire;

performing a plasma cleaning procedure; and filling a conductive material in the via hole to form a plug.

3. The method according to claim 2, further comprising, after plasma cleaning, forming a barrier layer on the sidewall and the bottom of the via hole.

4. The method according to claim 3, wherein the barrier layer is a Ti/TiN layer formed by deposition.

5. The method according to claim 1, wherein a method of smoothing the filling oxide layer is CMP.

6. The method according to claim 1, wherein a method of smoothing the filling oxide layer is etching.

7. The method according to claim 1, wherein a method of forming the first silicon-rich oxide layer is deposition.

8. The method according to claim 1, wherein a method of forming the second silicon-rich oxide layer is deposition.

9. The method according to claim 1, wherein a thickness of the first silicon-rich oxide layer is 1800~2200 angstroms.

10. The method according to claim 1, wherein a thickness of the second silicon-rich oxide layer is 800~1200 angstroms.

11. The method according to claim 1, wherein the plasma cleaning procedure is argon plasma cleaning.

12. The method according to claim 1, wherein the conductive material comprises tungsten.

* * * * *